United States Patent
Choi

(10) Patent No.: US 7,534,645 B2
(45) Date of Patent: May 19, 2009

(54) CMOS TYPE IMAGE SENSOR MODULE HAVING TRANSPARENT POLYMERIC ENCAPSULATION MATERIAL

(75) Inventor: Kyoung-Sei Choi, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 264 days.

(21) Appl. No.: 11/494,463

(22) Filed: Jul. 28, 2006

(65) Prior Publication Data

US 2006/0270094 A1 Nov. 30, 2006

Related U.S. Application Data

(62) Division of application No. 10/854,643, filed on May 27, 2004, now Pat. No. 7,105,904.

(30) Foreign Application Priority Data

Jun. 11, 2003 (KR) ............................. 2003-37458

(51) Int. Cl.
  *H01L 21/56* (2006.01)
  *H01L 27/146* (2006.01)
(52) U.S. Cl. ................... 438/64; 438/65; 438/118; 257/E31.117; 257/E31.118; 257/E21.503; 257/E23.132
(58) Field of Classification Search .............. 438/64, 438/65, 118, FOR. 136; 257/E31.117, E31.118, 257/E21.503, E23.132
See application file for complete search history.

(56) References Cited

U.S. PATENT DOCUMENTS

| 5,523,608 | A | * | 6/1996 | Kitaoka et al. ............... 257/433 |
| 5,932,875 | A | | 8/1999 | Chung et al. |
| 6,352,875 | B1 | * | 3/2002 | Hayashi et al. ............... 438/67 |
| 6,407,381 | B1 | * | 6/2002 | Glenn et al. ................. 250/239 |
| 6,559,539 | B2 | * | 5/2003 | Tu et al. ..................... 257/723 |
| 6,841,859 | B1 | | 1/2005 | Thamby et al. |
| 7,022,066 | B2 | * | 4/2006 | Yokoi et al. ................. 600/109 |
| 7,059,040 | B1 | * | 6/2006 | Webster et al. ................ 29/831 |
| 7,092,174 | B2 | * | 8/2006 | Yamaguchi et al. ......... 359/819 |
| 2003/0024986 | A1 | * | 2/2003 | Mazz et al. ................. 235/454 |
| 2003/0171649 | A1 | * | 9/2003 | Yokoi et al. ................. 600/109 |

(Continued)

FOREIGN PATENT DOCUMENTS

JP 63-043353 2/1998

(Continued)

*Primary Examiner*—George Fourson
(74) *Attorney, Agent, or Firm*—Volentine & Whitt, PLLC

(57) ABSTRACT

A CMOS type of image sensor module for use in a mobile camera or a PC camera includes an image sensing semiconductor chip encapsulated in a transparent block of polymeric material on a substrate having a circuit to which the ship is connected. The image sensing semiconductor chip is disposed on an upper surface of the substrate as spaced vertically from a digital signal processing second semiconductor chip mounted on a lower surface of the substrate. The transparent polymeric encapsulation material constitutes a sealing resin unit. The digital signal processing second semiconductor chip may also be encapsulated by the sealing resin unit. The sealing transfer unit can be formed by injection and/or transfer molding. The forming of the sealing resin unit by a single molding process keeps production costs low.

18 Claims, 3 Drawing Sheets

U.S. PATENT DOCUMENTS

| | | |
|---|---|---|
| 2003/0223008 A1 | 12/2003 | Kim et al. |
| 2004/0189862 A1* | 9/2004 | Gustavsson et al. ......... 348/376 |
| 2006/0091290 A1* | 5/2006 | Yoshihara et al. ........ 250/208.1 |
| 2006/0219884 A1* | 10/2006 | Tsukamoto et al. ......... 250/239 |
| 2006/0221225 A1* | 10/2006 | Tsukamoto et al. ......... 348/340 |
| 2008/0108168 A1* | 5/2008 | Yang et al. .................... 438/64 |

FOREIGN PATENT DOCUMENTS

| | | |
|---|---|---|
| KR | 2000-0048031 | 7/2000 |
| KR | 10-2001-0027091 | 4/2001 |
| KR | 2002-0066642 | 8/2002 |
| KR | 20020096198 | 12/2002 |

* cited by examiner

CMOS TYPE IMAGE SENSOR MODULE HAVING TRANSPARENT POLYMERIC ENCAPSULATION MATERIAL

CROSS REFERENCE TO RELATED APPLICATION

This is a Divisional of, and a claim of priority is made to, U.S. non-provisional application Ser. No. 10/854,643, filed May 27, 2004, now U.S. Pat. No. 7,105,904, the contents of which are incorporated herein by reference in their entirety.

BACKGROUND OF THE INVENTION

1. Field of the Invention

The present invention relates to an image pick up device for use in a mobile camera or the like. More particularly, the present invention relates to a CMOS type image sensor module including a semiconductor chip having a CMOS-based sensor for picking up an image, and a built-in digital signal processing semiconductor chip.

2. Description of the Related Art

An image sensor module of a camera is a multi-chip device that includes an image sensing semiconductor chip and a digital signal processing semiconductor chip. The image sensing semiconductor chip collects optical images, and the digital signal processing semiconductor chip converts the optical images into electrical signals. Based on the particular type of semiconductor used, the image sensor modules are classified as a charge coupled device (CCD) or a complementary metal oxide semiconductor (CMOS) device.

A CMOS type of image sensor module is disclosed in U.S. Pat. Application No. 2003-0025825, entitled "Small Image Pickup Module" filed on Aug. 29, 2002 by Olympus Optical Co., Ltd.

FIG. 1 is a cross-sectional view of the disclosed CMOS type of image sensor module. Referring to this figure, the CMOS type image sensor module has an image sensing semiconductor chip 12 and a digital signal processing semiconductor chip 18 which are mounted horizontally on a substrate 11 as spaced laterally from one another. In addition, a discrete lens kit 13 is connected to the substrate 11 by potting material 271 and 272 that also serves to create a seal between the lens kit 13 and substrate 11. The image sensing semiconductor chip 12 is protected by a transparent cover 25. The cover 25 and image sensing semiconductor chip 12 are secured to one another and to the substrate 11 by potting material 261 and 262. The digital signal processing semiconductor 18 is sealed by a syringe-type of potting material. Reference numbers 14, 15, and 16 designate an infrared filter, an optical lens, and a diaphragm, respectively.

However, the above-described CMOS type of image sensor module has disadvantages.

First, the manufacturing of the CMOS type of image sensor module is a complicated process entailing a high production cost because it involves creating a seal between the lens kit 13 and the substrate 11. Moreover, the image sensing semiconductor chip 12 and the digital signal processing semiconductor chip 18 are molded to the substrate 11 through separate processes.

Second, the difficulties and complexity of the manufacturing process, especially when adapted for mass production of the CMOS type of image sensor module, lead to frequent manufacturing defects. That is, the prior art CMOS type of image sensor module is manufactured with a relatively low productivity.

Third, the prior art CMOS type of image sensor module is relatively large because the image sensing semiconductor chip and the digital signal processing semiconductor chip are mounted to the substrate horizontally as spaced laterally from each other.

SUMMARY OF THE INVENTION

An object of the present invention is to provide a CMOS type of image sensor module that can be produced using a relatively simple process.

Another object of the present invention is to provide a compact CMOS type of image sensor module.

Still another object of the present invention is to provide a CMOS type of image sensor module that is easy to mass produce.

According to one aspect of the present invention, a CMOS type of image sensor module includes a substrate having a circuit pattern to which a chip may be wire bonded at either side thereof, a first semiconductor chip for image sensing mounted on an upper side of the substrate and wire-bonded to the circuit pattern, a second semiconductor chip for digital signal processing mounted on a lower side of the substrate and wire-bonded to the circuit pattern, and a sealing resin unit made of transparent polymeric encapsulation material encapsulating at least the first semiconductor chip.

In the case in which the sealing resin unit encapsulates only the first semiconductor chip, the second semiconductor chip is sealed using an epoxy molding compound (EMC).

In addition, the sealing resin unit may include a screw thread by which a lens kit may be coupled to the unit. The lens kit preferably includes a housing, and an optical lens and an infrared filter disposed vertically relative to one another within the housing. Alternatively, the sealing resin unit itself forms an optical lens. In this case, the lens constituted by the sealing resin unit can be coated with an infrared filter material.

According to another aspect of the present invention, a method of manufacturing a CMOS type of image sensor module includes: (a) providing a substrate having an integral circuit pattern to which a chip may be wire bonded at either side of the substrate, (b) mounting a digital signal processing semiconductor chip and a passive device on a lower side of the substrate, (c) wire-bonding the second semiconductor to the circuit at the lower side of the substrate, (d) mounting an image sensing semiconductor chip on an upper side of the substrate, (e) wire-bonding the image sensing semiconductor chip to the circuit at the upper side of the substrate, and (e) molding a transparent polymeric encapsulation material to the substrate over at least one of the chips on the substrate.

Preferably, the molding process comprises injection molding. In particular, the molding process may consist of injection molding. In addition, the molding process may comprise transfer molding as performed by conventional transfer molding equipment.

BRIEF DESCRIPTION OF THE DRAWINGS

The above and other features and advantages of the present invention will become more apparent from the following detailed description of the preferred embodiments thereof made with reference to the attached drawings, in which.

DETAILED DESCRIPTION OF THE PREFERRED EMBODIMENTS

The present invention now will be described more fully with reference to the accompanying drawings, in which specific embodiments of the invention are shown. Before the description proceeds, however, it is to be noted that the term "molding process" used in the specification refers to any type of molding process, i.e., is not limited to an injection molding process.

Figure 1:
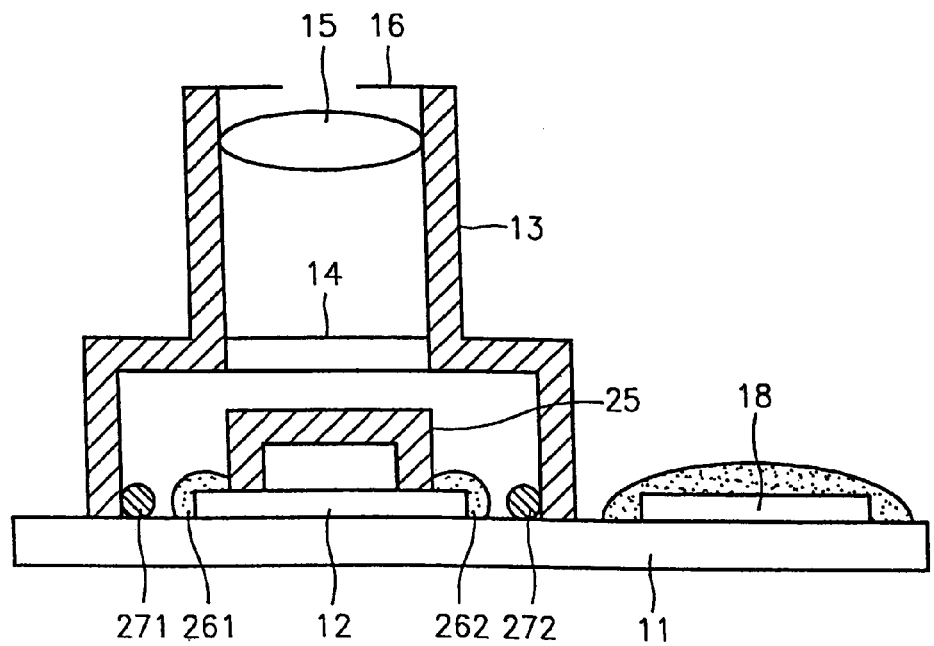
FIG. 1 is a cross-sectional view of a prior art CMOS type of image sensor module.
Figure 2:
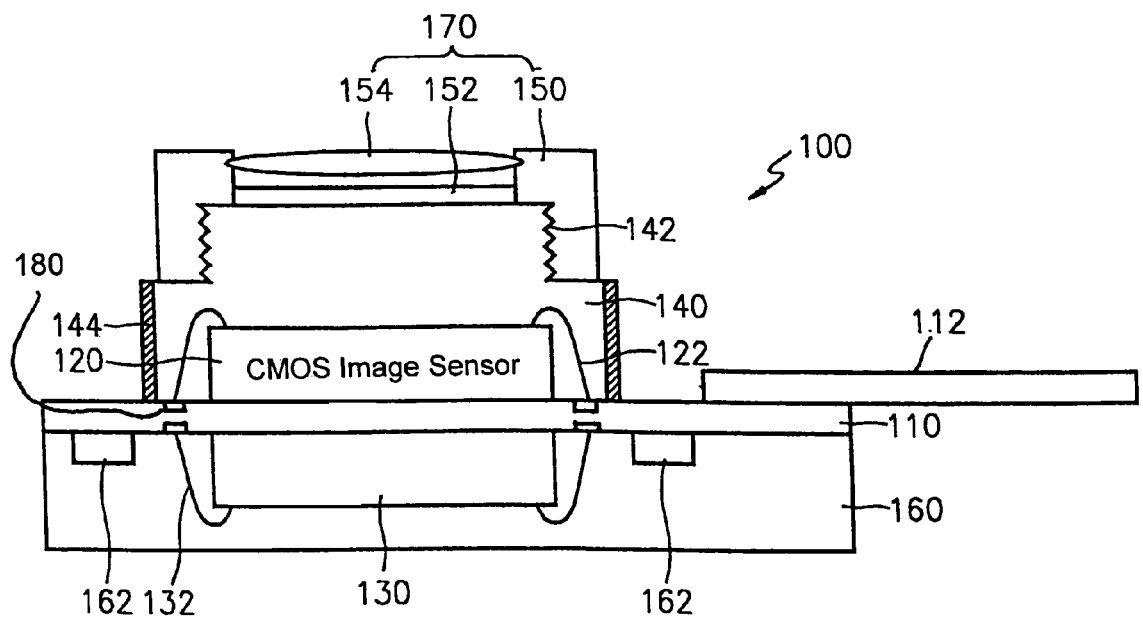
FIG. 2 is a cross-sectional view of a first embodiment of a CMOS type of image sensor module according to the present invention.

Referring to FIG. 2, a first embodiment of CMOS type of image sensor module 100 according to the present invention includes a substrate 110 having a base member and a circuit pattern 180 at both sides of the base member so that a chip can be wire bonded to the circuit pattern 180 at either side of the base member, a first semiconductor chip (image sensing chip having a CMOS type of image sensor) 120 mounted on an upper portion of the substrate 110 and wire-bonded to the circuit pattern thereof, a second semiconductor chip (digital signal processing chip) 130 mounted on a lower portion of the substrate 110 and wire-bonded to the circuit pattern thereof, and a sealing resin unit 140 of transparent polymeric encapsulation material formed on the surface of the substrate 110 by injection molding and in which the first semiconductor chip 120 is sealed.

The CMOS type of image sensor module 100 further includes an epoxy molding compound 160 on the lower portion of the substrate 110 and in which a passive device 162 and the second semiconductor chip 130 are sealed, protective material 144 attached to the side of the sealing resin unit 140, and a lens kit 170 coupled to the sealing resin unit 140. To this end, the sealing resin unit 140 has an external thread 142 onto which the lens kit 170 is screwed.

The protective material 144 is opaque so as to prevent the transmission of light into the sealing resin unit and is preferably in the form of a tape. The lens kit 170 includes a lens kit housing 150, and an optical lens 154 and an infrared filter 152 disposed vertically in the lens kit housing 150. The passive device 162 comprises small electronic components such as a resistor and a capacitor. Gold wires 122 and 132 preferably electrically connect the first semiconductor chip 120 and the second semiconductor chip 130 to the substrate 110. Reference number 112 designates a flexible printed circuit board (FPCB) that is a mother board to which the CMOS type of image sensor module 110 is mounted.

The sealing resin unit 140 may be made of a thermoplastic polymeric material. In this case, the temperature at which sealing resin unit will deform is very low—ranging between 100 and 120° C. Thus, a CMOS type of image sensor module including such thermoplastic polymeric encapsulation material should be connected to the FPCB 112 using a process conducted at a low temperature. Similarly, the CMOS type of image sensor module 100 and FPCB 112 may be joined by applying heat locally at their interface or by using an anisotropic conductive film (ACF).

In general, though, the transparent polymeric encapsulation material of the sealing resin unit 140 may be made of polymethylmethacrylate (PMMA), a polycarbonate (PC), a thermosetting transparent epoxy, or a transparent ABS. PMMA is a material widely-used for optical products such as CDs, lenses, and LCD displays. ABS is a thermoplastic resin made from acrylonitrile, butadiene, and styrene, and is widely-used in electronic, automotive, and industrial products. As a transparent epoxy, a non-filler type of transparent epoxy generally used in manufacturing light-emitting diodes (LEDs) can be used. The non-filler type of transparent epoxy can be transfer-molded to the substrate 110 at a temperature of around 150° C.

A second embodiment of the present invention will now be described with reference to FIG. 3. However, those parts of the second embodiment that are similar to those the first embodiment will not be described for the sake of brevity.

Figure 3:
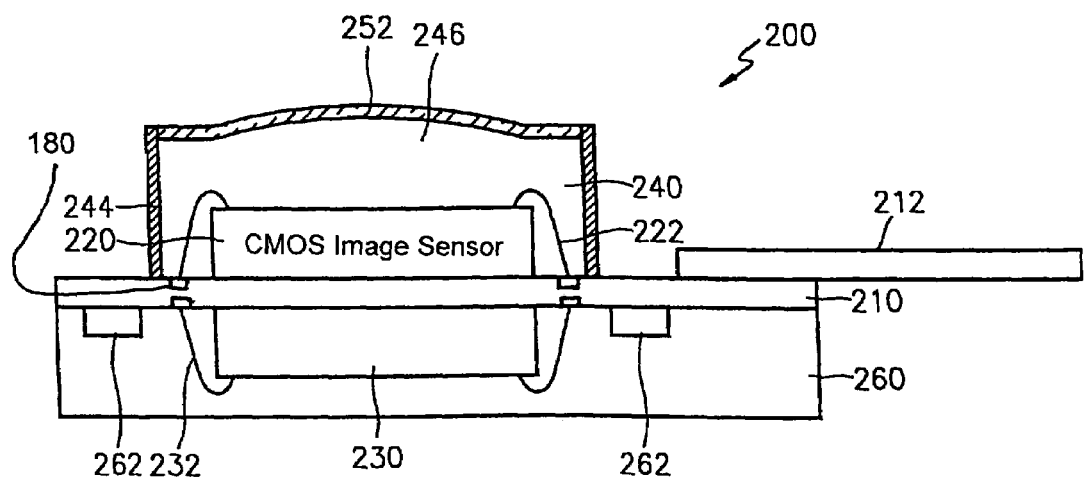
FIG. 3 is a cross-sectional view of a second embodiment of a CMOS type of image sensor module according to the present invention.

Referring now to FIG. 3, in the second embodiment of the CMOS type of image sensor module 200, the sealing resin unit 240 constitutes a plastic optical lens 246 that serves the role of the lens 154 of the lens kit unit 170 of the first embodiment. That is, the plastic lens 246 is formed by the curved upper portion of the sealing resin unit 240. An infrared filter 252 coats the surface of the optical lens. Reference numerals 222, 232 designate bonding wires, 262 a passive device, and 212 a flexible printed circuit board (FPCB).

The CMOS type of image sensor modules 100 and 200 can be manufactured as follows.

First, a substrate 110, 210 including a circuit pattern at both sides thereof is prepared. The doubled-sided substrate 110, 210 is similar to that of a ball grid array (BGA) package. Then, a digital signal processing semiconductor chip 130, 230 and a passive device 162, 262 are mounted on a lower side of the substrate, and the chip 130, 230 is wire-bonded to the circuit pattern using gold wires 132, 232.

Next, the digital signal processing semiconductor chip 130, 230 and passive device 162, 262 are sealed within an epoxy molding compound (EMC) 160, 260 molded to the lower side of the substrate 110, 210 using a conventional process per se. Then, the image sensing semiconductor chip 120, 220 is mounted on an upper side of the substrate 110, 210 and is wire-bonded to the circuit pattern of the substrate 110, 210 using the gold wires 122, 222.

Finally, the sealing resin unit 140, 240 is formed by molding a transparent polymeric encapsulation material to the upper side of the substrate 110, 210. In the first embodiment, the molding process forms the thread 142 at the upper portion of the sealing resin unit 140, and by which the lens kit 170 is screwed onto the resin unit 140. On the other hand, in the second embodiment, the molding process forms a plastic optical lens at the upper portion of the sealing resin unit 240, and the lens is then coated with an infrared filtering material 252. A protective material 144, 244 in the form of, for example, a tape, can be attached to the side of the sealing resin unit 140, 240 to prevent light from being transmitted through the side of the sealing resin unit 140, 240.

When the sealing resin unit 140, 240 is formed of a PC or a transparent ABS, the injection molding temperature is preferably between 200 and 250° C. and the injection molding pressure is 800 kgf/cm$^2$. However, these parameters depend on the specific composition and molecular weight of the transparent polymeric encapsulation material.

Figure 4:
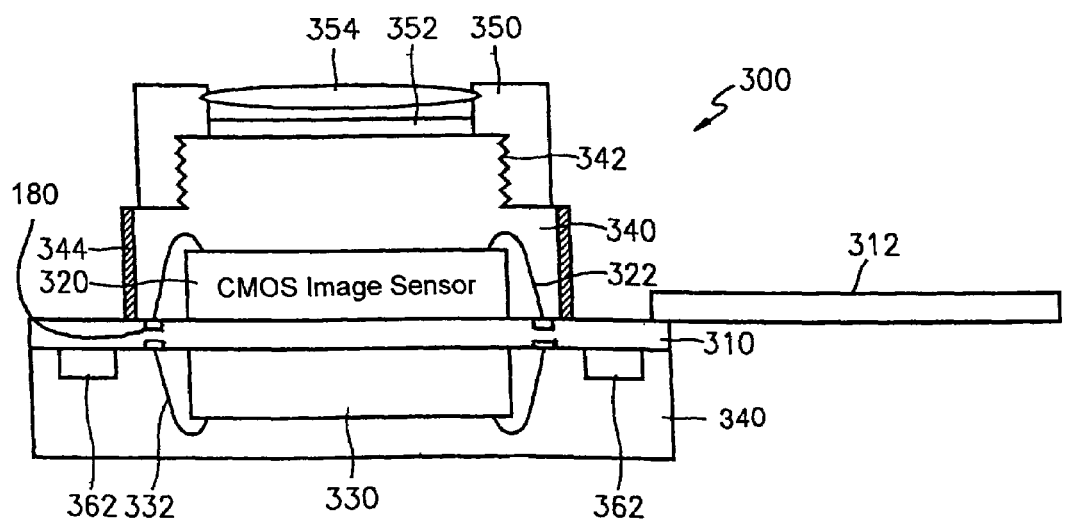
FIG. 4 is a cross-sectional view of a third embodiment of a CMOS type of image sensor module according to the present invention.

A third embodiment of a CMOS type of image sensor module according to the present invention will now be described with reference to FIG. 4.

In this embodiment, a sealing resin unit 340 is formed on both the upper and lower portion of a substrate 310, i.e., an epoxy compound is not molded to the lower portion of the substrate 310. The remaining parts are identical to those of the embodiment of FIG. 2. For instance, the sealing resin unit 340 has a screw thread 342, and a lens kit is threaded to the sealing resin unit 342. The lens kit includes a lens housing 350, an infrared filter 352, and an optical lens 354. Reference numerals 322, 332 designate bonding wires, 362 a passive device, and 312 a flexible printed circuit board (FPCB).

Figure 5:
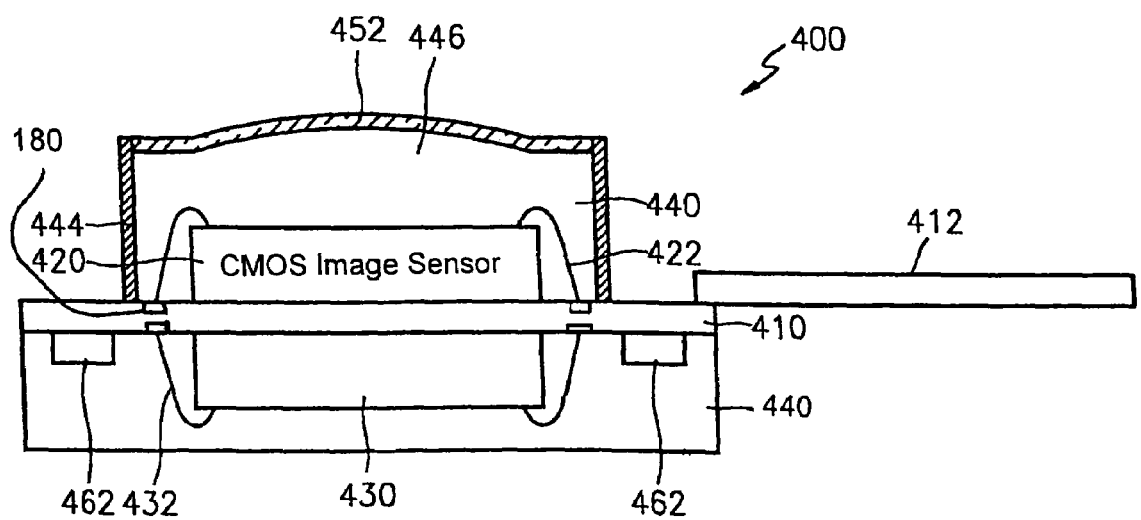
FIG. 5 is a cross-sectional view of a fourth embodiment of a CMOS type of image sensor module according to the present invention.

A fourth embodiment of a CMOS type of image sensor module according to the present invention will now be described with reference to FIG. 5.

This embodiment is the same as the third embodiment in that a sealing resin unit 440 is formed on both the upper and lower portions of the substrate 410, i.e., an epoxy compound is not molded to the lower portion of the substrate 410. In this embodiment, though, like the second embodiment of FIG. 3, an optical lens 446 is formed by the upper portion of the sealing resin unit 440, and the plastic lens 446 is coated with an infrared filter 452. Reference numerals 422, 432 designate bonding wires, 462 a passive device, and 412 a flexible printed circuit board (FPCB).

Methods of manufacturing CMOS type of image sensor modules 300 and 400 according to the present invention will be described below.

First, a substrate 310, 410 including a circuit pattern at both sides thereof is prepared. The doubled-sided substrate 310, 410 is similar to that of a ball grid array (BGA) package. Then, a digital signal processing semiconductor chip 330, 430 and a passive device 362, 462 are mounted on a lower portion of the substrate. The chip 330, 430 is wire-bonded to the circuit pattern using gold wires 332, 432. Then, the image sensing semiconductor chip 320, 420 is mounted on an upper portion of the substrate 310, 410 and is wire-bonded to the circuit pattern of the substrate 310, 410 using the gold wires 322, 422. However, this order of mounting the chips to the upper and lower sides of the substrate can be reversed.

Next, a transparent polymeric encapsulation material is molded to the upper and lower portions of the substrate 110, 210 to form the sealing resin unit 340, 440, and thereby encapsulate the digital signal processing semiconductor chip 330, 430 and passive device 362, 462, as well as the image sensing semiconductor chip 320, 420. This molding process can consist of an injection molding process or may comprise a combination of transfer and injection molding processes.

In the third embodiment, the molding process can be used to form the thread 342 at the upper portion of the sealing resin unit 340, and by which the lens kit is screwed onto the resin unit 340. On the other hand, in the fourth embodiment, the molding process forms a plastic optical lens at the upper portion of the sealing resin unit 340, and the lens is then coated with an infrared filtering material 352. A protective material 344, 444 in the form of, for example, a tape, can be attached to the side of the sealing resin unit 340, 440 to prevent light from being transmitted through the side of the sealing resin unit 340, 440. Finally, the substrate 310, 410 is connected under a low temperature to FPCB 312, 412 using an ACF.

Therefore, advantages of the present invention as described above are as follows.

First, the overall manufacturing process is relatively simple. Thus, production costs are kept to a minimum.

Secondly, the use of injection molding by the present invention facilitates the mass production of the CMOS type of image sensor modules.

Third, the CMOS type of image sensor module is relatively small because the image sensing chip and the digital signal processing chip are arranged vertically one above the other on the substrate.

Although the present invention has been particularly shown and described with reference to the preferred embodiments thereof, various changes in the form and details thereof will be apparent to those of ordinary skill in the art that. For example, although the protective material for the sealing resin unit has been described as being in the form of tape, the protective material can take the form of other types of coatings. Accordingly, the present invention can be practiced in ways other than those described in detail in the specification without departing from the true spirit and scope of the present invention as defined by the following claims.

What is claimed is:

1. A method of manufacturing a CMOS type of image sensor module, the method comprising:
   providing a substrate having a base member and a circuit pattern at both sides of the base member;
   mounting a digital signal processing semiconductor chip, capable of processing a digital signal, and a passive electronic device on a lower one of the sides of the substrate;
   wire-bonding the digital signal processing semiconductor chip to the circuit pattern at the lower one of the sides of the base member;
   embedding the digital signal processing semiconductor chip and the passive electronic device in an epoxy molding compound by molding the epoxy molding compound to the lower one of the sides of the substrate over the digital signal processing semiconductor chip;
   mounting an image sensing semiconductor chip, having a CMOS image sensor capable of picking up an optical image, on an upper one of the sides of the substrate, and wire-bonding the image sensing semiconductor chip to the circuit pattern at the upper one of the sides of the base member; and
   embedding the image sensing chip in a transparent polymeric material by molding transparent polymeric material to the upper one of the sides of the substrate over the entirety of the image sensing semiconductor chip to thereby form a sealing resin unit in which the image sensing semiconductor chip is encapsulated by the polymeric material.

2. The manufacturing method of claim 1, wherein said molding of the polymeric material includes forming a screw thread on an upper portion of the resin sealing unit.

3. The manufacturing method of claim 2, and further comprising coupling a lens kit to the resin sealing unit by screwing the lens kit onto the unit using the screw thread thereof.

4. The manufacturing method of claim 1, wherein said molding of the polymeric material comprises injection molding, and the forming of an optical lens from the transparent polymeric material.

5. The manufacturing method of claim 4, and further comprising coating the lens with a material that filters infrared light.

6. The manufacturing method of claim 1, and further comprising securing opaque material along sides of the resin sealing unit to prevent light from being transmitted through the sides of the unit.

7. The manufacturing method of claim 1, wherein said molding of the transparent polymeric material comprises injection molding.

8. A method of manufacturing a CMOS type of image sensor module, comprising:
   providing a substrate having a base member and a circuit pattern at both sides of the base member;

mounting a digital signal processing semiconductor chip, capable of processing a digital signal, and a passive electronic device on a lower one of the sides of the substrate;

wire-bonding the digital signal processing semiconductor chip to the circuit pattern at the lower one of the sides of the base member;

mounting an image sensing semiconductor chip, having a CMOS image sensor capable of picking up an optical image, on an upper one of the sides of the substrate, and wire-bonding the image sensing semiconductor chip to the at the upper one of the sides of the base member; and embedding the digital signal processing semiconductor chip, the passive electronic device and the image sensing chip in a transparent polymeric material by molding the transparent polymeric material to the upper and lower sides of the substrate over the entirety of the image sensing semiconductor chip and over the digital signal processing semiconductor chip and the passive electronic device to thereby form a sealing resin unit in which the chips and the passive electronic device are encapsulated by the polymeric material.

9. The manufacturing method of claim 8, wherein said molding of the polymeric material includes forming a screw thread on an upper portion of the resin sealing unit.

10. The manufacturing method of claim 8, and further comprising coupling a lens kit to the resin sealing unit by screwing the lens kit onto the unit using the screw thread thereof.

11. The manufacturing method of claim 8, wherein said molding of the polymeric material comprises injection molding, and the forming of an optical lens from the transparent polymeric material at the upper one of the sides of the substrate.

12. The manufacturing method of claim 11, and further comprising coating the lens with a material that filters infrared light.

13. The manufacturing method of claim 8, and further comprising securing opaque material along sides of a portion of the resin sealing unit disposed above the upper one of the sides of the substrate, to prevent light from being transmitted through the sides of the unit adjacent the image sensing semiconductor chip.

14. The manufacturing method of claim 8, wherein said molding a transparent polymeric material to the upper and lower sides of the substrate comprises injection molding.

15. A method of manufacturing a CMOS type of image sensor module, the method comprising:

providing a substrate;

mounting a digital signal processing semiconductor chip, capable of processing a digital signal, on a lower one of the sides of the substrate;

wire-bonding the digital signal processing semiconductor chip to the substrate;

mounting an image sensing semiconductor chip, having a CMOS image sensor capable of picking up an optical image, on an upper one of the sides of the substrate;

wire-bonding the image sensing semiconductor chip to substrate; and embedding at least the image sensing chip in a transparent polymeric material by molding the transparent polymeric material to the substrate over the entirety of the image sensing semiconductor chip to thereby form a sealing resin unit in which the image sensing semiconductor chip is encapsulated by the polymeric material, wherein the molding of the transparent polymeric material includes forming a screw thread at an upper portion of the resin sealing unit.

16. The manufacturing method of claim 15, and further comprising coupling a lens kit to the resin sealing unit by screwing the lens kit onto the unit using the screw thread thereof.

17. The manufacturing method of claim 15, wherein the transparent polymeric material is molded to the upper one of the sides of the substrate, and further comprising embedding the digital signal processing semiconductor chip in an epoxy molding compound by molding the epoxy molding compound to the lower one of the sides of the substrate.

18. The manufacturing method of claim 15, wherein the molding embeds both the image sensing chip and the digital signal processing semiconductor chip in the transparent polymeric material.

* * * * *